United States Patent [19]

Kuo

[11] Patent Number: 5,801,565

[45] Date of Patent: Sep. 1, 1998

[54] HIGH SPEED DIFFERENTIAL DATA LATCH

[75] Inventor: James R. Kuo, Cupertino, Calif.

[73] Assignee: National Semiconductor Corporation, Santa Clara, Calif.

[21] Appl. No.: 612,100

[22] Filed: Mar. 7, 1996

[51] Int. Cl.$^6$ ................................................. H03K 3/289
[52] U.S. Cl. ........................... 327/202; 327/52; 327/57; 327/203
[58] Field of Search ........................... 327/202, 52, 57, 327/203

[56] References Cited

FOREIGN PATENT DOCUMENTS

| 402134916 | 5/1990 | Japan | 327/202 |
| 405110389 | 4/1993 | Japan | 327/202 |

OTHER PUBLICATIONS

William R. Blood, Jr., "MECL System Design Handbook", Fourth Edition, 1988, pp. 12–14.

*Primary Examiner*—Margaret Rose Wambach
*Attorney, Agent, or Firm*—Limbach & Limbach L.L.P.

[57] ABSTRACT

A high speed differential data latch includes identical master and slave flip-flops. The master flip-flop is driven by a differential input data signal while both flip-flops are driven by a shared differential clock signal. Each flip-flop includes: one differential amplifier for sequentially latching the differential input data signal to provide a differential output data signal; a second differential amplifier for generating two switched supply currents from the clock signal for powering the differential data amplifier; and a third differential amplifier cross-coupled to the differential data amplifier for providing positive feedback thereto for enhancing the latching speed. The differential output data signal follows the differential input data signal during one of the differential clock states and remains latched during the other differential clock state.

40 Claims, 7 Drawing Sheets

FIGURE 7

HIGH SPEED DIFFERENTIAL DATA LATCH

BACKGROUND OF THE INVENTION

1. Field of the Invention

The present invention relates to binary data latches, and in particular, to differential binary data latches capable of high speed latching or sampling of data.

2. Description of the Related Art

In modern data communications systems, the data being communicated is generally done so in a serial manner and must, therefore, often be converted to a parallel format at its destination for subsequent processing. However, as data communication rates have increased, inherent limitations in conventional serial data interface circuits, with respect to their latching capabilities, have limited the maximum data rates.

The performance characteristics which typically limit the data rate of such circuits are those of setup and hold times. With combined setup and hold times typically totalling several nanoseconds, the sampling, or latching, rates of such circuits become limited to several hundred megabits per second due to the data pulse widths needed to maintain such setup and hold times.

Accordingly, it would be desirable to have a data latch with significantly reduced minimum setup and hold times.

SUMMARY OF THE INVENTION

A high speed differential data latch in accordance with one embodiment of the present invention includes a differential data amplifier and a differential feedback amplifier. The differential data amplifier is for receiving one phase of a differential clock signal, a differential input data signal and a feedback signal and in accordance therewith providing a differential output data signal. The differential feedback amplifier is coupled to the differential data amplifier and is for receiving the other phase of the differential clock signal and the differential output data signal and in accordance therewith providing the feedback signal. The differential clock signal includes two differential clock states, and the differential output data signal follows the differential input data signal during one of the differential clock states and remains latched during the other differential clock state.

A high speed differential data latch in accordance with another embodiment of the present invention includes a differential current switch and two differential amplifiers. The differential current switch is for receiving a supply current and a differential clock signal and in accordance therewith providing two switched currents. The differential clock signal includes two differential clock states and the switched currents are provided in response thereto. One of the differential amplifiers is coupled to the differential current switch and is for receiving one of the switched currents, a differential input data signal and a feedback signal and in accordance therewith providing a differential output data signal. The other differential amplifier is coupled to the differential current switch and the first differential amplifier and is for receiving the other switched current and the differential output data signal and in accordance therewith providing the feedback signal. The differential output data signal follows the differential input data signal during one of the differential clock states and remains latched during the other differential clock state.

These and other features and advantages of the present invention will be understood upon consideration of the following detailed description of the invention and the accompanying drawings.

DETAILED DESCRIPTION OF THE INVENTION

Figure 1:
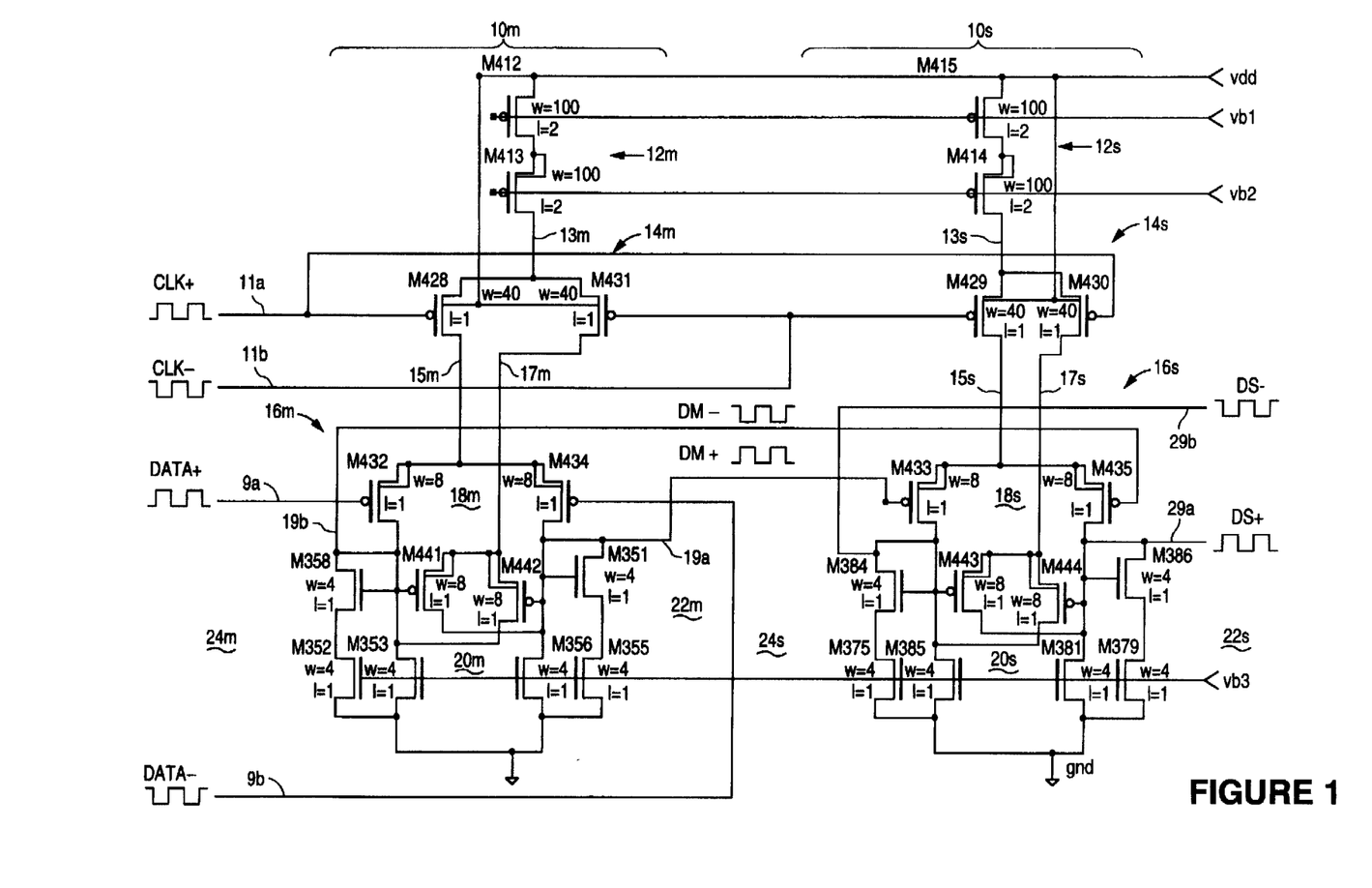
FIG. 1 is a schematic diagram of a high speed differential data latch in accordance with one embodiment of the present invention.
Figure 2:
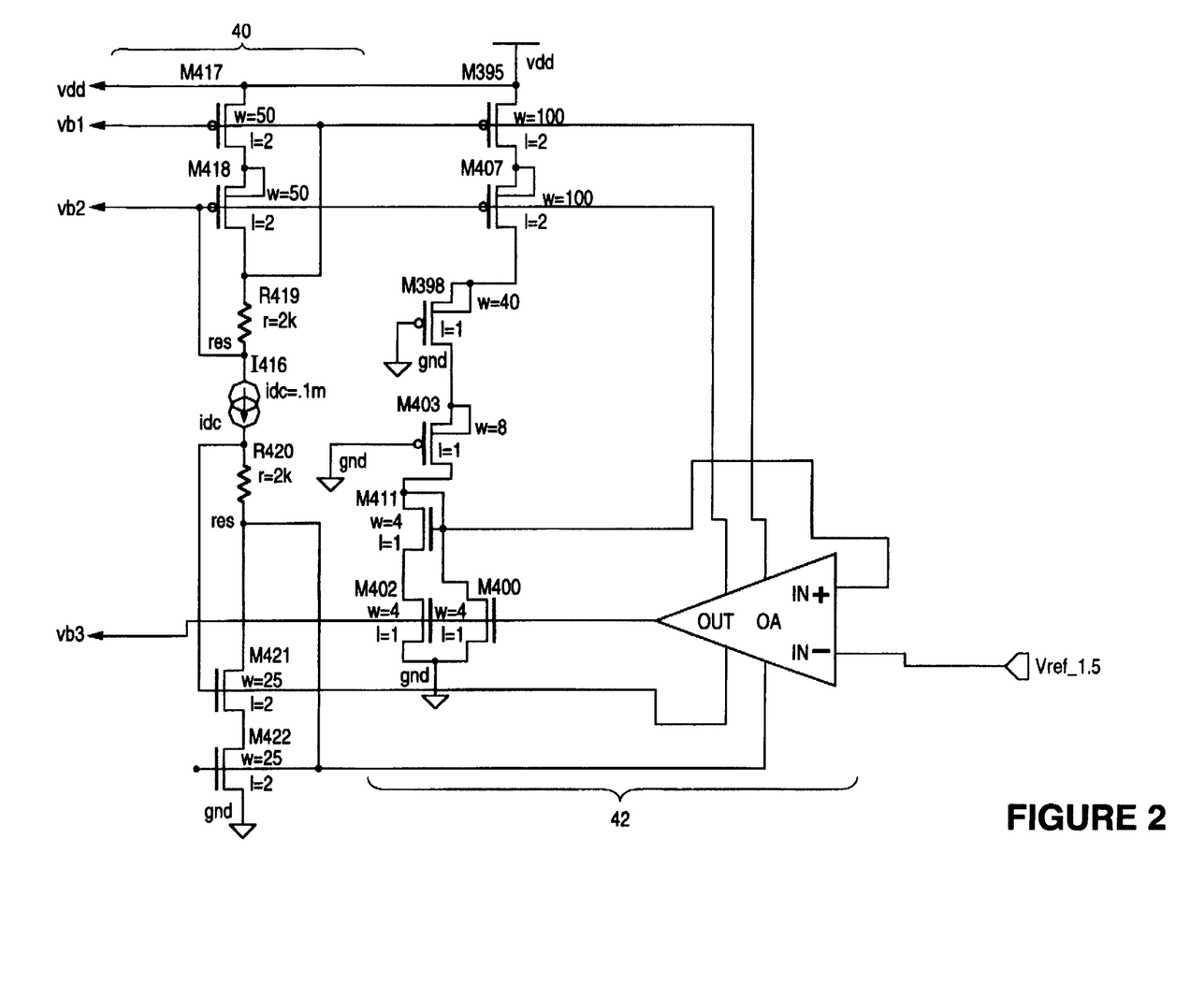
FIG. 2 is a schematic diagram of a voltage biasing circuit for the data latch of FIG. 1.

FIGS. 1 and 2 use well know schematic symbols and indicia for representing P-type and N-type metal oxide semiconductor field effect transistors ("MOSFETs") and pertinent parameters therefor. For example, transistors M428 and M431 are P-type MOSFETs whose: source terminals are connected together; gate terminals are driven by the primary 11a and secondary 11b phases of a differential input clock signal CLK+/CLK−; substrates, or "bulks," are connected to the power supply terminal VDD; channel length ("L") and width ("W") are 1 micron and 40 microns, respectively; and number of fingers ("F") equals 4. Transistors M352 and M353 are N-type MOSFETs whose: source terminals are connected together and to the circuit reference, or ground; gate terminals are connected together and biased by a bias voltage VB3; and channel lengths and widths and number of fingers are 1 micron, 4 microns and 2, respectively.

Referring to FIG. 1, a high speed differential data latch in accordance with one embodiment of the present invention includes a master flip-flop 10m and a slave flip-flop 10s. The master flip-flop 10m includes a current source 12m, a differential current switch 14m and a differential amplifier 16m. The differential amplifier 16m includes a differential data amplifier 18m, a differential feedback amplifier 20m and two active load amplifiers 22m, 24m.

The current source 12m is formed by transistors M412 and M413 totem-pole-coupled together between the power supply voltage VDD (e.g. 5 volts) and the current switch 14m. The gate terminals of transistors M412 and M413 are biased by bias voltages VB1 and VB2 (discussed in more detail below), respectively, and provide a supply current 13m to the current switch 14m. In accordance with the primary 11a and secondary 11b phases of a differential clock signal CLK+/CLK−, the current switch 14m switches its supply current 13m to provide a switched supply current 15m (corresponding inversely to the primary phase 11a) to the data amplifier 18m and another switched supply current 17m (corresponding inversely to the secondary phase 11b) to the feedback amplifier 20m.

The feedback amplifier 20m is cross coupled with the data amplifier 18m by having the gate terminals of transistors M441 and M442 and the drain terminals of transistors M442 and M441 connected to the drain terminals of transistors M432 and M434, respectively. As discussed in more detail below, this results in the feedback amplifier 20m providing positive feedback to the data amplifier 18m. The gate terminals of transistors M432 and M434 of the data amplifier 18m are driven by the primary 9a and secondary 9b phases of the differential input data signal DATA+/DATA−. The gate terminals of active load transistors M352, M353, M355 and M356 are biased by a third biasing voltage VB3 (discussed in more detail below).

When the state of the differential clock signal CLK+/CLK− is such that its primary phase 11a is low and, therefore, its secondary phase 11b is high, the data amplifier 18m is powered by its switched current 15m, while the feedback amplifier 20m receives no switched current 17m (due to the action of the current switch 14m, as discussed above). Accordingly, the master differential output data signal DM+/DM− from the master flip-flop 10m follows the differential input data signal DATA+/DATA−, with the primary 19a and secondary 19b master output data phases following the corresponding primary 9a and secondary 9b input data phases, respectively.

Conversely, when the state of the differential clock signal CLK+/CLK− is such that its primary phase 11a is high and, therefore, its secondary phase 11b is low, the data amplifier 18m is disabled, i.e. it receives no switched current 15m, while the feedback amplifier 20m is enabled, i.e. it is powered by its switched current 17m. The aforementioned positive feedback provided by the feedback amplifier 20m causes such disabling of the data amplifier 18m to occur very rapidly. This results in the data phases 19a, 19b of the master differential output data signal DM+/DM− to remain latched in their previous data states.

The slave flip-flop 10s is functionally identical to that of the master flip-flop 10m. Accordingly, operation of the individual elements of the slave flip-flop 10s (with the "s" designator suffix) are identical to those described above for the master flip-flop 10m (with the "m" designator suffix), with one difference. That difference is that the connections for the primary 11a and secondary 11b phases of the differential clock signal CLK+/CLK− for the differential current switch 14s of the slave flip-flop 10s are reversed with respect to those for the current switch 14m of the master flip-flop 10m. Hence, the slave differential data amplifier 18s is enabled when the secondary clock phase 11b is low and the slave differential feedback amplifier 20s is enabled when the primary clock phase 11a is low. Accordingly, the primary 29a and secondary 29b phases of the slave differential output data signal DS+/DS− follow those of the primary 19a and secondary 19b phases of the master differential output data signal DM+/DM−, respectively, while the secondary clock phase 11b is low and remain latched in their previous data states when the primary clock phase 11a is low.

Referring to FIG. 2, a biasing circuit suitable for providing the aforementioned biasing voltages VB1, VB2 and VB3 includes a bias voltage generator 40 and a voltage clamp 42. The bias voltage generator 40 includes a totem-pole-coupled arrangement of transistors M417, M418, M421 and M422, resistors R419 and R420, and current source 1416, all interconnected as shown. This bias voltage generator 40, driven by the power supply voltage VDD (e.g. 3.3 volts), produces biasing voltages VB1 (e.g. 2.5 volts) and VB2 (e.g. 2.2 volts).

The voltage clamp 42 includes a totem-pole-coupled arrangement of transistors M395, M407, M398, M403, M411, M402 and M400, and operational amplifier ("op-amp") OA, all interconnected as shown. The gate terminals of transistors M395 and M407, as well as op-amp OA, are biased by biasing voltages VB1 and VB2. Other sections of op-amp OA are biased by voltages generated at the gate terminals of transistors M421 and M422. The inverting input of op-amp OA is driven by a reference voltage VREF (e.g. 1.5 volts). Due to the closed loop provided by the interconnection of transistors M403, M411, M402 and M400 to op-amp OA, the voltage at its non-inverting input is also established at the potential of the reference voltage VREF (due to the well known characteristic of op-amps of a virtual short circuit between the input terminals). Accordingly, the output of op-amp OA provides biasing voltage VB3 (e.g. 1.2 volts). With reference to FIGS. 1 and 2 together, a number of advantages realized with a high speed differential data latch in accordance with such embodiment of the present invention include programmable output signal levels, insensitivity of the output signal levels to variations or fluctuations in the power supply VDD voltage, and reduced jittering in the output signals caused by variations or fluctuations in the power supply VDD voltage. All of these advantages are realized by virtue of the interaction between the voltage clamp circuit 42 and master 10m and slave 10s flip-flops.

As discussed above, the closed loop provided by the interconnection of transistors M403, M411, M402 and M400 to op-amp OA, the voltages at both the inverting and non-inverting inputs of op-amp OA are equal to the reference voltage VREF. This causes the output signal phases DM+ 19a, DM− 19b, DS+ 29a, DS− 29b to have peak voltage levels which are equal to the potentials of the reference voltage VREF and circuit ground GND. This is due to the fact that the "programming node" connecting the gate and drain terminals of transistor M411 and drain terminals of transistors M400 and M403 is electrically similar to the output signal nodes of the master 10m and slave 10s flip-flops, i.e. the four nodes which connect: the gate and drain terminals of transistor M358 and drain terminals of transistors M353 and M432; the gate and drain terminals of transistor M351 and drain terminals of transistors M356 and M434; the gate and drain terminals of transistor M384 and drain terminals of transistors M385 and M433; and the gate and drain terminals of transistor M386 and drain terminals of transistors M381 and M435. Hence, in accordance with the voltage potential of the reference voltage VREF and, therefore, the voltage potential at the "programming node," the voltage levels of the output signal phases DM+ 19a, DM− 19b, DS+ 29a, DS− 29b have peak voltage levels which are equal to the potentials of the reference voltage VREF and circuit ground GND. Accordingly, the output signal levels can be programmed by adjusting the reference voltage VREF. For similar reasons, the output signal levels are insensitive to and have reduced jittering caused by variations or fluctuations in the power supply VDD voltage, since the voltage clamp circuit 42 is primarily responsible for establishing the biasing of the master 16m and slave 16s differential data amplifiers.

Figure 3:
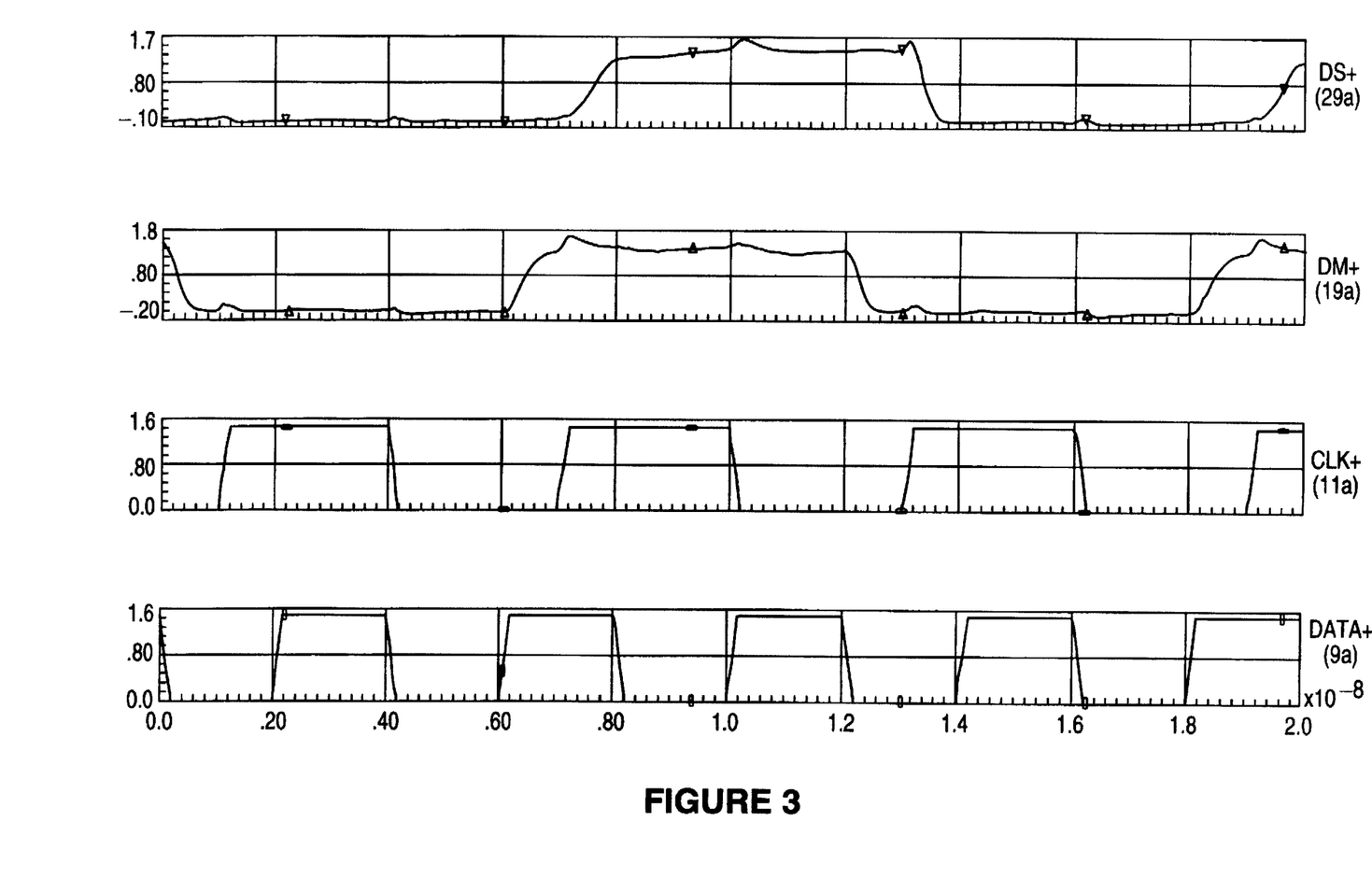
FIG. 3 is a signal timing diagram for the data latch of FIG. 1 with data sampling occurring at the midpoint of the incoming data pulse.
Figure 4:
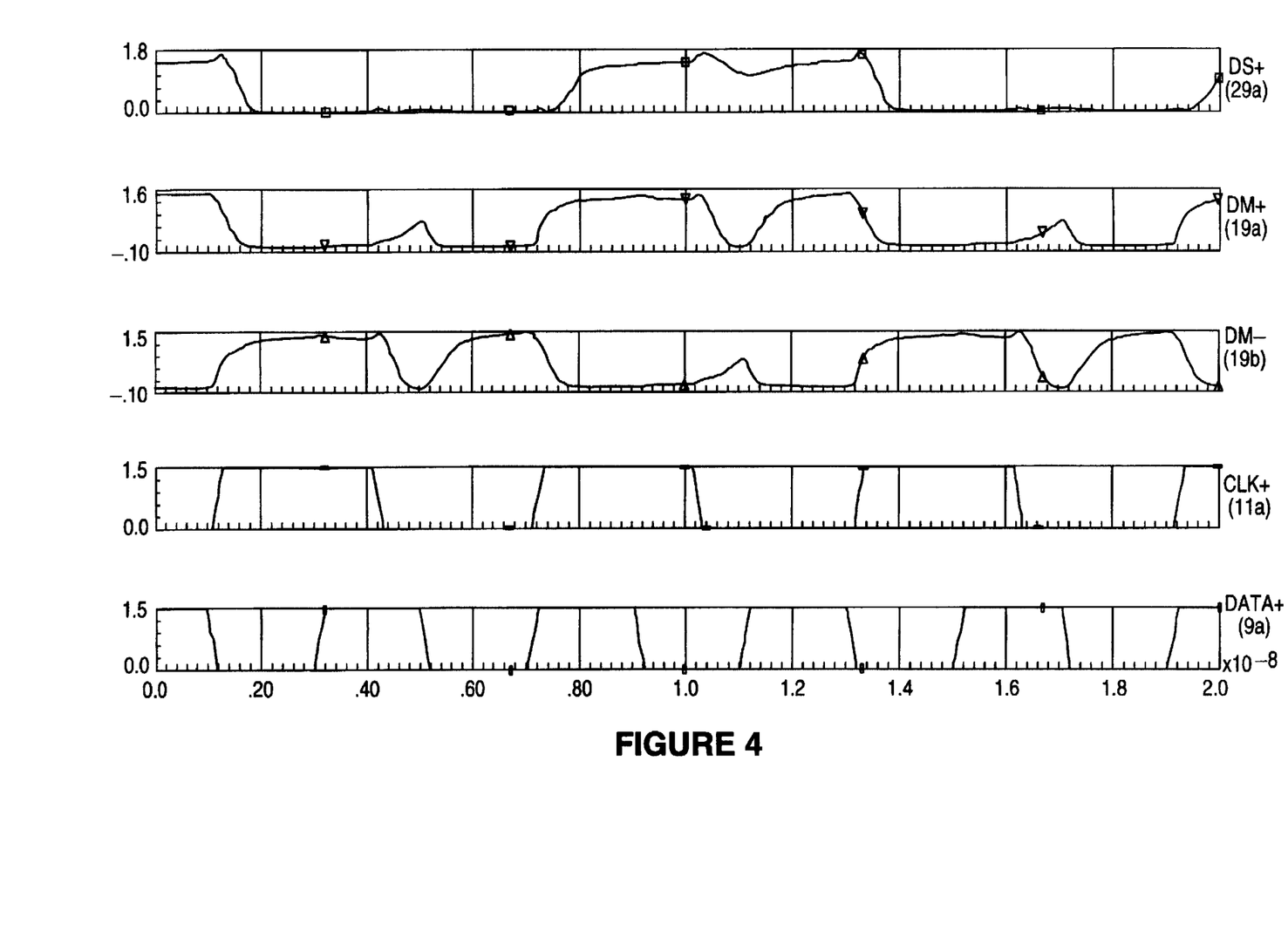
FIG. 4 is a signal timing diagram for the data latch of FIG. 1 with a data setup time of 100 picoseconds (ps).

Referring to FIG. 3, typical data latching, or sampling, with the master 10m and slave 10s flip-flops of FIG. 1 occurs at shown. As discussed above, when the primary differential clock phase 11a is low (e.g. non-asserted), the state of the primary master output data phase 19a follows that of the primary input data phase 9a. When the primary clock phase 11a goes high (e.g. asserted), the primary master data output phase 19a remains latched and the primary slave output data phase 29a begins to follow that of the primary master data output phase 19a. When the primary clock phase 11a once again goes low, the primary slave output data phase 29a becomes latched. Referring to FIG. 4, due to the positive feedback action of the feedback amplifiers 20m, 20s, the master 10m and slave 10s flip-flops of the differential data latch of FIG. 1 have very low setup times. FIG. 4 illustrates voltage switching waveforms for a setup time of 100 ps. When the primary clock phase 11a goes high, 100 ps after the primary input data phase 9a goes high, the primary 19a and secondary 19b master output data phases go high and low, respectively, initially due to the residual enablement of the master data amplifier 18m by its switched current supply 15m as it turns off. However, this transition is further enhanced by the positive feedback action of the master feedback amplifier 20m due to its enablement by its switched current supply 17m as it turns on.

Figure 5:
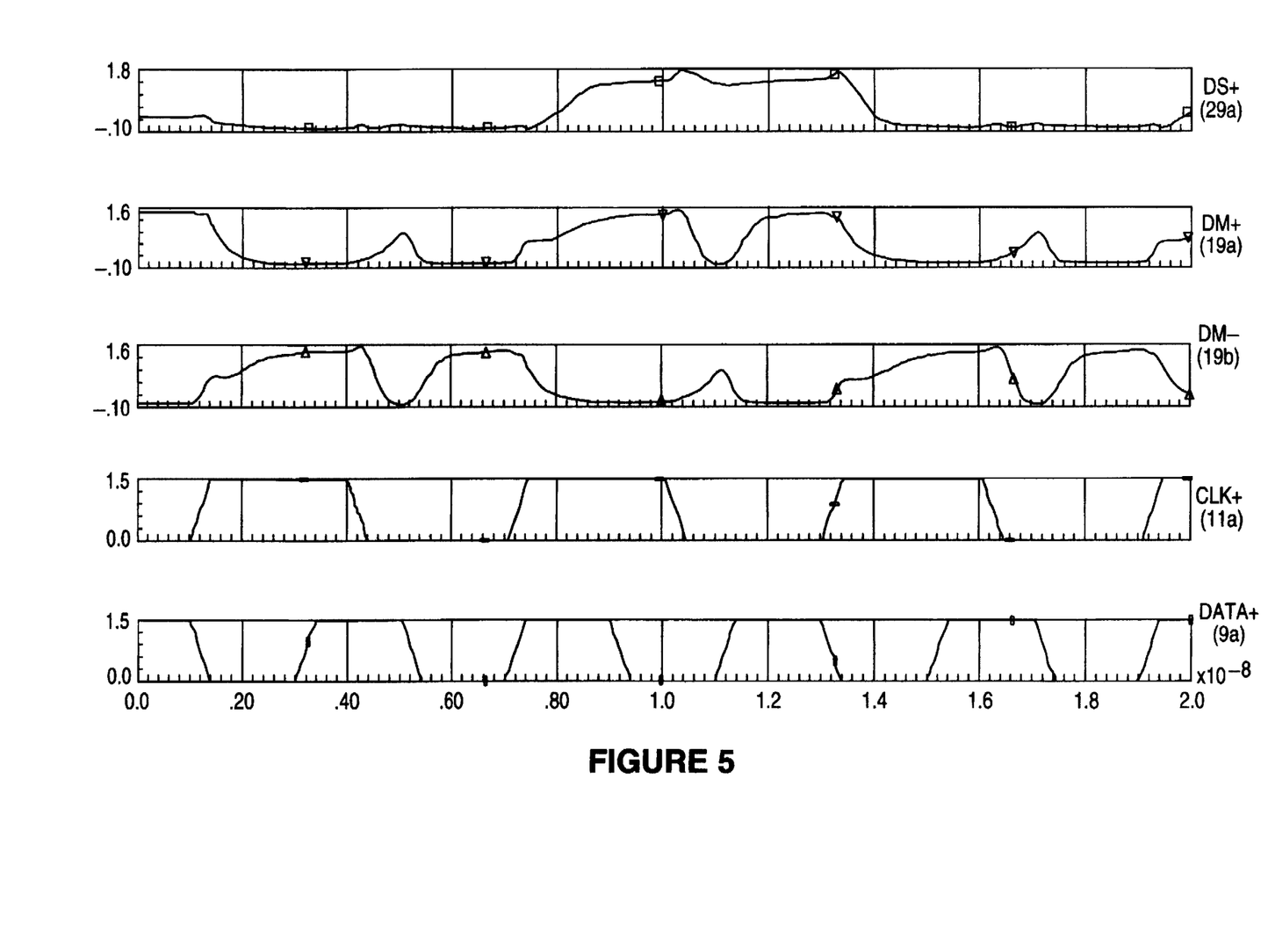
FIG. 5 is a signal timing diagram for the data latch of FIG. 1 with a data setup time of 50 ps.

Referring to FIG. 5, similar voltage switching waveforms are shown for a setup time of 50 ps.

Figure 6:
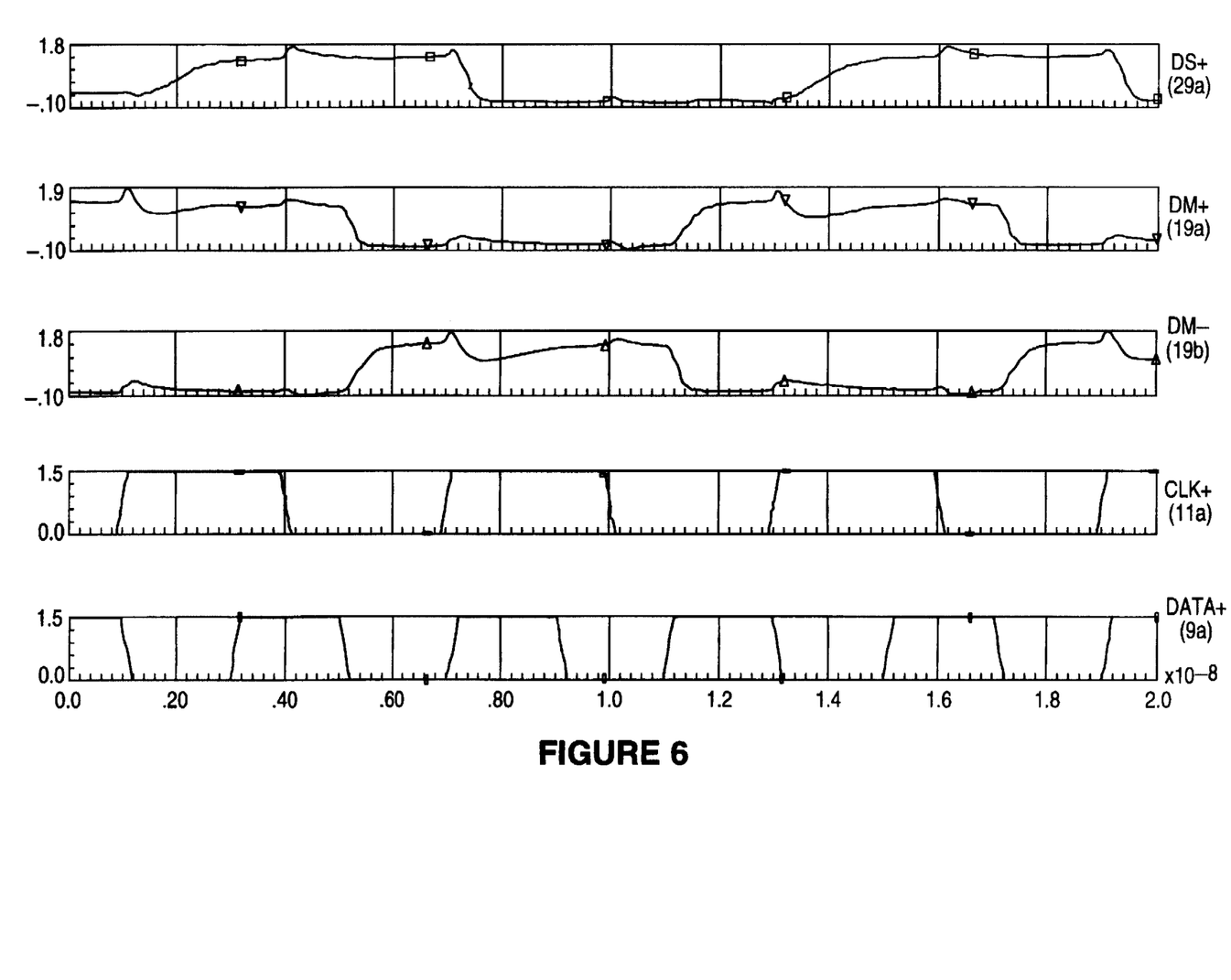
FIG. 6 is a signal timing diagram for the data latch of FIG. 1 with a data hold time of 100 ps.

Referring to FIG. 6, due to the positive feedback action of the feedback amplifiers 20m, 20s, the master 10m and slave 10s flip-flops of the differential data latch of FIG. 1 also have positive, near-zero hold times. FIG. 6 illustrates voltage switching waveforms for a hold time of 100 ps. When the primary clock phase 11a is low, the primary master differential output data phase 19a follows the primary differential input data phase 9a. When the primary clock phase 11a goes high, the primary master differential output data phase 19a becomes latched. (The slight drop in the voltage of the secondary master differential output data phase 19b is caused by a parasitic capacitive coupling at the gate terminal of transistor M435 in the slave differential data amplifier 18s.) The high-to-low transition of the primary slave differential output data phase 29a reflects the sampling of a low state of the primary differential input data phase 9a. The low-to-high transition of the primary slave differential output data phase 29a after the primary clock phase 11a goes high reflects a sampling of a high state of the primary differential input data phase 9a.

Figure 7:
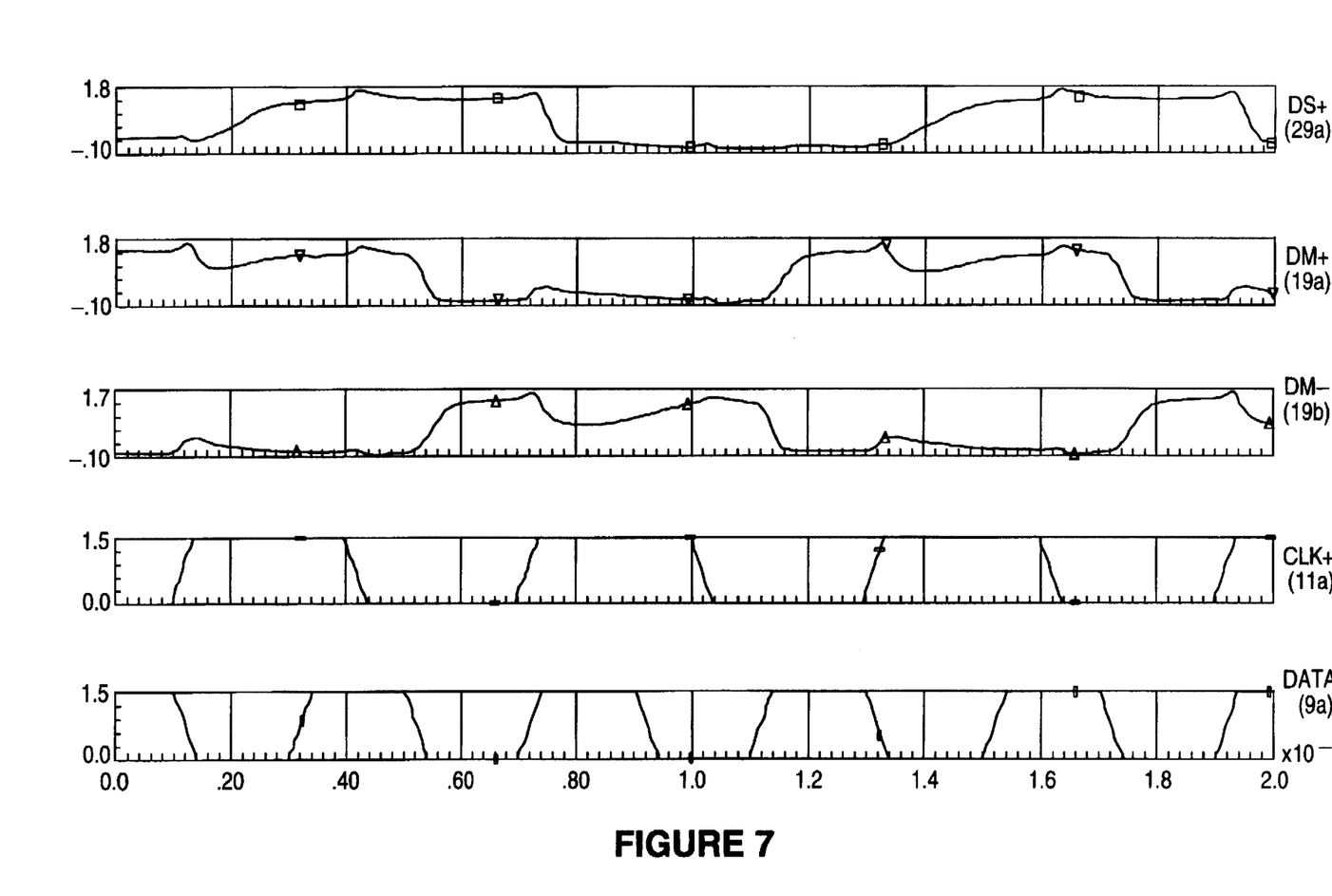
FIG. 7 is a signal timing diagram for the data latch of FIG. 1 with a data hold time of 50 ps.

Referring to FIG. 7, similar voltage switching waveforms are shown for a hold time of 50 ps.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a high speed differential data latch, said data latch comprising:
    a first differential data amplifier for receiving a first phase only of a differential clock signal which includes said first phase and a second phase, a differential input data signal and a first feedback signal and in accordance therewith providing a first differential output data signal; and
    a first differential feedback amplifier, coupled to said first differential data amplifier, for receiving said second phase only of said differential clock signal and said first differential output data signal and in accordance therewith providing said first feedback signal;
    wherein said differential clock signal includes first and second differential clock states, and said first differential output data signal follows said differential input data signal during said first differential clock state and remains latched during said second differential clock state.

2. The apparatus of claim 1, wherein said first differential feedback amplifier includes a pair of inputs and a pair of outputs which are cross-coupled to said first differential data amplifier.

3. The apparatus of claim 1, wherein said data latch further comprises first and second nodes, to which said first differential data amplifier and said first differential feedback amplifier are coupled, for receiving said first feedback signal and providing said first differential output data signal.

4. The apparatus of claim 1, wherein said first feedback signal provides positive feedback to said first differential data amplifier.

5. The apparatus of claim 1, wherein said first differential data amplifier is further for receiving a selectively variable bias voltage and said first differential output data signal has a peak-to-peak signal voltage which corresponds to said selectively variable bias voltage.

6. An apparatus including a high speed differential data latch, said data latch comprising:
    a first differential data amplifier for receiving a first phase of a differential clock signal, a differential input data signal and a first feedback signal and in accordance therewith providing a first differential output data signal;
    a first differential feedback amplifier, coupled to said first differential data amplifier, for receiving a second phase of said differential clock signal and said first differential output data signal and in accordance therewith providing said first feedback signal;
    a second differential data amplifier, coupled to said first differential data amplifier, for receiving said second phase of said differential clock signal, said first differential output data signal and a second feedback signal and in accordance therewith providing a second differential output data signal; and
    a second differential feedback amplifier, coupled to said second differential data amplifier, for receiving said first phase of said differential clock signal and said second differential output data signal and in accordance therewith providing said second feedback signal;
    wherein said differential clock signal includes first and second differential clock states, and said first differential output data signal follows said differential input data signal during said first differential clock state and remains latched during said second differential clock state; and
    wherein said second differential output data signal follows said first differential output data signal during said second differential clock state and remains latched during said first differential clock state.

7. The apparatus of claim 6, wherein said first differential feedback amplifier includes a first pair of inputs and a first pair of outputs which are cross-coupled to said first differential data amplifier and said second differential feedback amplifier includes a second pair of inputs and a second pair of outputs which are cross-coupled to said second differential data amplifier.

8. The apparatus of claim 6, wherein said data latch further comprises first and second nodes, to which said first differential data amplifier and said first differential feedback amplifier are coupled, for receiving said first feedback signal and providing said first differential output data signal, and wherein said data latch still further comprises third and fourth nodes, to which said second differential data amplifier and said second differential feedback amplifier are coupled, for receiving said second feedback signal and providing said second differential output data signal.

9. The apparatus of claim 6, wherein said first feedback signal provides positive feedback to said first differential data amplifier and said second feedback signal provides positive feedback to said second differential data amplifier.

10. The apparatus of claim 6, wherein said first and second differential data amplifiers are further for receiving first and second selectively variable bias voltages and said first and second differential output data signals have first and second peak-to-peak signal voltages which correspond to said first and second selectively variable bias voltages, respectively.

11. The method of claim 6, wherein said step of receiving said second switched current and said first differential output data signal and in accordance therewith providing said first feedback signal comprises cross-coupling said first differential output data signal and said first feedback signal, and wherein said step of receiving said fourth switched current and said second differential output data signal and in accordance therewith providing said second feedback signal comprises cross-coupling said second differential output data signal and said second feedback signal.

12. An apparatus including a high speed differential data latch, said data latch comprising:
   a first differential current switch for receiving a first supply current and a differential clock signal and in accordance therewith providing first and second switched currents, wherein said differential clock signal includes first and second differential clock states, and wherein said first and second switched currents are provided in response to said first and second differential clock states, respectively;
   a first differential amplifier, coupled to said first differential current switch, for receiving said first switched current only of said first and second switched currents, a differential input data signal and a first feedback signal and in accordance therewith providing a first differential output data signal; and
   a second differential amplifier, coupled to said first differential current switch and said first differential amplifier, for receiving said second switched current only of said first and second switched currents and said first differential output data signal and in accordance therewith providing said first feedback signal;
   wherein said first differential output data signal follows said differential input data-signal during said first differential clock state and remains latched during said second differential clock state.

13. The apparatus of claim 12, wherein said second differential amplifier includes a pair of inputs and a pair of outputs which are cross-coupled to said first differential amplifier.

14. The apparatus of claim 12, wherein said data latch further comprises first and second nodes, to which said first and second differential amplifiers are coupled, for receiving said first feedback signal and providing said first differential output data signal.

15. The apparatus of claim 12, wherein said first feedback signal provides positive feedback to said first differential amplifier.

16. The apparatus of claim 12, wherein said first differential amplifier is further for receiving a selectively variable bias voltage and said first differential output data signal has a peak-to-peak signal voltage which corresponds to said selectively variable bias voltage.

17. An apparatus including a high speed differential data latch, said data latch comprising:
   a first differential current switch for receiving a first supply current and a differential clock signal and in accordance therewith providing first and second switched currents, wherein said differential clock signal includes first and second differential clock states, and wherein said first and second switched currents are provided in response to said first and second differential clock states, respectively;
   a first differential amplifier, coupled to said first differential current switch, for receiving said first switched current, a differential input data signal and a first feedback signal and in accordance therewith providing a first differential output data signal;
   a second differential amplifier, coupled to said first differential current switch and- said first differential amplifier, for receiving said second switched current and said first differential output data signal and in accordance therewith providing said first feedback signal;
   a second differential current switch for receiving a second supply current and said differential clock signal and in accordance therewith providing third and fourth switched currents, wherein said third and fourth switched currents are provided in response to said second and first differential clock states, respectively;
   a third differential amplifier, coupled to said second differential current switch and said first differential amplifier, for receiving said third switched current, said first differential output data signal and a second feedback signal and in accordance therewith providing a second differential output data signal; and
   a fourth differential amplifier, coupled to said second differential current switch and said third differential amplifier, for receiving said fourth switched current and said second differential output data signal and in accordance therewith providing said second feedback signal;
   wherein said first differential output data signal follows said differential input data signal during said first differential clock state and remains latched during said second differential clock state; and
   wherein said second differential output data signal follows said first differential output data signal during said second differential clock state and remains latched during said first differential clock state.

18. The apparatus of claim 17, wherein said second differential amplifier includes a first pair of inputs and a first pair of outputs which are cross-coupled to said first differential amplifier and said fourth differential amplifier includes a second pair of inputs and a second pair of outputs which are cross-coupled to said third differential amplifier.

19. The apparatus of claim 17, wherein said data latch further comprises first and second nodes, to which said first and second differential amplifiers are coupled, for receiving said first feedback signal and providing said first differential output data signal, and wherein said data latch still further comprises third and fourth nodes, to which said third and fourth differential amplifiers are coupled, for receiving said second feedback signal and providing said second differential output data signal.

20. The apparatus of claim 17, wherein said first feedback signal provides positive feedback to said first differential amplifier and said second feedback signal provides positive feedback to said third differential amplifier.

21. The apparatus of claim 17, wherein said firs and third differential amplifiers are further for receiving first and second selectively variable bias voltages and said first and second differential output data signals have first and second peak-to-peak signal voltages which correspond to said first and second selectively variable bias voltages, respectively.

22. A method of latching differential data at high speed, said method comprising the steps of:

receiving a first phase only of a differential clock signal which includes said first phase and a second phase, a differential input data signal and a first feedback signal and in accordance therewith providing a first differential output data signal; and receiving said second phase only of said differential clock signal and said first differential output data signal and in accordance therewith providing said first feedback signal;

wherein said differential clock signal includes first and second differential clock states, and said first differential output data signal follows said differential input data signal during said first differential clock state and remains latched during said second differential clock state.

23. The method of claim 21, wherein said step of receiving said second phase only of said differential clock signal and said first differential output data signal and in accordance therewith providing said first feedback signal comprises cross-coupling said first differential output data signal and said first feedback signal.

24. The method of claim 22, wherein said step of receiving said second phase only of said differential clock signal and said first differential output data signal and in accordance therewith providing said first feedback signal comprises receiving said first differential output data signal and providing said first feedback signal via first and second nodes.

25. The method of claim 22, wherein said step of receiving said second phase only of said differential clock signal and said first differential output data signal and in accordance therewith providing said first feedback signal comprises providing positive feedback for use in said step of receiving a first phase only of a differential clock signal which includes said first phase and a second phase, a differential input data signal and a first feedback signal and in accordance therewith providing a first differential output data signal.

26. The method of claim 22, further comprising the step of receiving a selectively variable bias voltage, wherein said step of receiving a first phase only of a differential clock signal which includes said first phase and a second phase, a differential input data signal and a first feedback signal and in accordance therewith providing a first differential output data signal comprises providing said first differential output data signal with a peak-to-peak signal voltage which corresponds to said selectively variable bias voltage.

27. A method of latching differential data at high speed, said method comprising the steps of:

receiving a first phase of a differential clock signal, a differential input data signal and a first feedback signal and in accordance therewith providing a first differential output data signal;

receiving a second phase of said differential clock signal and said first differential output data signal and in accordance therewith providing said first feedback signal;

receiving said second phase of said differential clock signal, said first differential output data signal and a second feedback signal and in accordance therewith providing a second differential output data signal; and receiving said first phase of said differential clock signal and said second differential output data signal and in accordance therewith providing said second feedback signal;

wherein said differential clock signal includes first and second differential clock states, and said first differential output data signal follows said differential input data signal during said first differential clock state and remains latched during said second differential clock state; and wherein said second differential output data signal follows said first differential output data signal during said second differential clock state and remains latched during said first differential clock state.

28. The method of claim 27, wherein said step of receiving a second phase of said differential clock signal and said first differential output data signal and in accordance therewith providing said first feedback signal comprises cross-coupling said first differential output data signal and said first feedback signal, and wherein said step of receiving said first phase of said differential clock signal and said second differential output data signal and in accordance therewith providing said second feedback signal comprises cross-coupling said second differential output data signal and said second feedback signal.

29. The method of claim 27, wherein said step of receiving a second phase of said differential clock signal and said first differential output data signal and in accordance therewith providing said first feedback signal comprises receiving said first differential output data signal and providing said first feedback signal via first and second nodes, and wherein said step of receiving said first phase of said differential clock signal and said second differential output data signal and in accordance therewith providing said second feedback signal comprises receiving said second differential output data signal and providing said second feedback signal via third and fourth nodes.

30. The method of claim 27, wherein said step of receiving a second phase of said differential clock signal and said first differential output data signal and in accordance therewith providing said first feedback signal comprises providing positive feedback for use in said step of receiving a first phase of a differential clock signal, a differential input data signal and a first feedback signal and in accordance therewith providing a first differential output data signal, and wherein said step of receiving said first phase of said differential clock signal and said second differential output data signal and in accordance therewith providing said second feedback signal comprises providing positive feedback for use in said step of receiving said second phase of said differential clock signal, said first differential output data signal and a second feedback signal and in accordance therewith providing a second differential output data signal.

31. The method of claim 27, further comprising the step of receiving first and second selectively variable bias voltages, wherein said step of receiving a first phase of a differential clock signal, a differential input data signal and a first feedback signal and in accordance therewith providing a first differential output data signal comprises providing said first differential output data signal with a first peak-to-peak signal voltage which corresponds to said first selectively variable bias voltage, and wherein said step of receiving said second phase of said differential clock signal, said first differential output data signal and a second feedback signal and in accordance therewith providing a second differential output data signal comprises providing said second differential output data signal with a second peakto-peak signal voltage which corresponds to said second selectively variable bias voltage.

32. A method of latching differential data at high speed, said method comprising the steps of:

receiving a first supply current and a differential clock signal and in accordance therewith providing first and second switched currents, wherein said differential clock signal includes first and second differential clock states, and wherein said first and second switched currents are provided in response to said first and second differential clock states, respectively;

receiving said first switched current only of said first and second switched currents, a differential input data signal and a first feedback signal and in accordance therewith providing a first differential output data signal; and receiving said second switched current only of said first and second switched currents and said first differential output data signal and in accordance therewith providing said first feedback signal;

wherein said first differential output data signal follows said differential input data signal during said first differential clock state and remains latched during said second differential clock state.

33. The method of claim 32, wherein said step of receiving said second switched current only of said first and second switched currents and said first differential output data signal and in accordance therewith providing said first feedback signal comprises cross-coupling said first differential output data signal and said first feedback signal.

34. The method of claim 32, wherein said step of receiving said second switched current only of said first and second switched currents and said first differential output data signal and in accordance therewith providing said first feedback signal comprises receiving said first differential output data signal and providing said first feedback signal via first and second nodes.

35. The method of claim 32, wherein said step of receiving said second switched current only of said first and second switched currents and said first differential output data signal and in accordance therewith providing said first feedback signal comprises providing positive feedback for use in said step of receiving said first switched current only of said first and second switched currents, a differential input data signal and a first feedback signal and in accordance therewith providing a first differential output data signal.

36. The method of claim 32, further comprising the step of receiving a selectively variable bias voltage, wherein said step of receiving said first switched current only of said first and second switched currents, a differential input data signal and a first feedback signal and in accordance therewith providing a first differential output data signal comprises providing said first differential output data signal with a peak-to-peak signal voltage which corresponds to said selectively variable bias voltage.

37. A method of latching differential data at high speed, said method comprising the steps of:

receiving a first supply current and a differential clock signal and in accordance therewith providing first and second switched currents, wherein said differential clock signal includes first and second differential clock states, and wherein said first and second switched currents are provided in response to said first and second differential clock states, respectively;

receiving said first switched current, a differential input data signal and a first feedback signal and in accordance therewith providing a first differential output data signal;

receiving said second switched current and said first differential output data signal and in accordance therewith providing said first feedback signal;

receiving a second supply current and said differential clock signal and in accordance therewith providing third and fourth switched currents, wherein said third and fourth switched currents are provided in response to said second and first differential clock states, respectively;

receiving said third switched current, said first differential output data signal and a second feedback signal and in accordance therewith providing a second differential output data signal; and receiving said fourth switched current and said second differential output data signal and in accordance therewith providing said second feedback signal;

wherein said first differential output data signal follows said differential input data signal during said first differential clock state and remains latched during said second differential clock state; and wherein said second differential output data signal follows said first differential output data signal during said second differential clock state and remains latched during said first differential clock state.

38. The method of claim 37, wherein said step of receiving said second switched current and said first differential output data signal and in accordance therewith providing said first feedback signal comprises receiving said first differential output data signal and providing said first feedback signal via first and second nodes, and wherein said step of receiving said fourth switched current and said second differential output data signal and in accordance therewith providing said second feedback signal comprises receiving said second differential output data signal and providing said second feedback signal via third and fourth nodes.

39. The method of claim 37, wherein said step of receiving said second switched current and said first differential output data signal and in accordance therewith providing said first feedback signal comprises providing positive feedback for use in said step of receiving said first switched current, a differential input data signal and a first feedback signal and in accordance therewith providing a first differential output data signal, and wherein said step of receiving said fourth switched current and said second differential output data signal and in accordance therewith providing said second feedback signal comprises providing positive feedback for use in said step of receiving said third switched current, said first differential output data signal and a second feedback signal and in accordance therewith providing a second differential output data signal.

40. The method of claim 37, further comprising the step of receiving first and second selectively variable bias voltages, wherein said step of receiving said first switched current, a differential input data signal and a first feedback signal and in accordance therewith providing a first differential output data signal comprises providing said first differential output data signal with a first peak-to-peak signal voltage which corresponds to said first selectively variable bias voltage, and wherein said step of receiving said third switched current, said first differential output data signal and a second feedback signal and in accordance therewith providing a second differential output data signal comprises providing said second differential output data signal with a second peak-to-peak signal voltage which corresponds to said second selectively variable bias voltage.

* * * * *

UNITED STATES PATENT AND TRADEMARK OFFICE
CERTIFICATE OF CORRECTION

PATENT NO.: 5,801,565
DATED: September 1, 1998
INVENTOR(S): James R. Kuo

It is certified that four errors appear in the above-identified patent and that said Letters Patent is hereby corrected as shown below:

In Col. 7, line 12, delete "6" and replace with --37--.

In Col. 8, line 13, delete "and-" and replace with --and--.

In Col. 8, line 62, delete "firs" and replace with --first--.

In Col. 9, line 19, delete "21" and replace with --22--.

Signed and Sealed this

Eighth Day of December, 1998

Attest:

BRUCE LEHMAN

Attesting Officer

Commissioner of Patents and Trademarks